(12) United States Patent
Peng

(10) Patent No.: US 6,864,756 B2
(45) Date of Patent: Mar. 8, 2005

(54) AUTOMATIC GAIN CONTROL CIRCUIT FOR CONTROLLING START-UP TIME OF OSCILLATOR AND METHOD THEREOF

(75) Inventor: Yung-Chow Peng, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 48 days.

(21) Appl. No.: 10/604,652

(22) Filed: Aug. 7, 2003

(65) Prior Publication Data

US 2004/0212444 A1 Oct. 28, 2004

(30) Foreign Application Priority Data

Apr. 22, 2003 (TW) .......................... 92109304 A

(51) Int. Cl.[7] .............................. H03B 5/06; H03L 3/00
(52) U.S. Cl. ....................................... 331/173; 331/172
(58) Field of Search ................................. 331/109, 172, 331/173, 182, 183

(56) References Cited

U.S. PATENT DOCUMENTS 4,956,618 A * 9/1990 Ulmer .................. 331/116 FE

* cited by examiner

Primary Examiner—David Mis
(74) Attorney, Agent, or Firm—Jianq Chyun IP Office

(57) ABSTRACT

An automatic gain control circuit for controlling a start-up time of an oscillator and a method thereof are provided. An oscillation detection unit is used to detect the start-up time of the oscillator. In addition, a control unit is used to move the start-up time of the oscillator forward when the start-up time of the oscillator is later than a first predetermined time point. Moreover, when the start-up time of the oscillator is earlier than a second predetermined time point, the start-up time of the oscillator is delayed.

14 Claims, 5 Drawing Sheets

AUTOMATIC GAIN CONTROL CIRCUIT FOR CONTROLLING START-UP TIME OF OSCILLATOR AND METHOD THEREOF

CROSS REFERENCE TO RELATED APPLICATIONS

This application claims the priority benefit of Taiwan application serial no. 92109304, filed on Apr. 22, 2003.

BACKGROUND OF INVENTION

1. Field of the Invention

This invention relates in general to an automatic gain control circuit and its related method. More specifically, the present invention relates to an automatic gain control (AGC) circuit for controlling a start-up time of an oscillator and a method thereof.

2. Description of Related Art

In the wireless communication field, since an on-off keying RF (radio frequency) receiver with a super-regenerative architecture has a better performance/cost ratio with respect to sensitivity and noise immunity, the on-off keying RF receiver is widely used, such as in remote-controlled model cars and in other remote-controlled electrical appliances, devices or equipments. In such circuit structure, for maintaining its performance under a best condition, it is necessary to use an automatic gain control circuit to control the start-up time of an oscillator.

FIG. 1 is a schematic diagram showing a signal modulation of a on-off keying RF transceiver. Referring to FIG. 1, when input data Din is "1", its corresponding transmitted output signal Sout is a high level signal modulated by a carrier wave, while when input data Din is "0", a level of its corresponding transmitted output signal Sout is 0.

FIG. 2 is a schematic block diagram showing a super-regenerative RF receiver, and FIG. 3 shows a signal relationship of the super-regenerative RF receiver. Referring to FIGS. 2 and 3, a saw-tooth wave generator 220 generates a saw-tooth wave output current Iq according to a quench control signal qnch. An oscillator 210 receives the saw-tooth wave output current Iq and an RF signal Srf to generate an oscillation output Sosc. When the received RF signal Srf is "1" that is a signal modulated by a carrier wave, the oscillation output Sosc of the oscillator 210 has an earlier oscillation time as shown in FIG. 3. When the received RF signal Srf is "0", the oscillation output Sosc of the oscillator 210 has a later oscillation time as shown in FIG. 3. In this manner, received data is reproduced, so that subsequent circuits can restore received data.

In order to stabilize the oscillation output Sosc of the oscillator 210, the super-regenerative RF receiver further comprises an automatic gain control circuit 230 for controlling a magnitude of the saw-tooth wave output current Iq generated by the saw-tooth wave generator 220 and for adjusting the start-up time of the oscillation output Sosc of the oscillator 210.

One can refer to IEEE JSSC Vol. 36, pp. 440, "A low-power CMOS super-regenerative receiver at 1 GHz" for descriptions of a conventional automatic gain control circuit. In general, a gm-C low pass filter is used to extract an energy level of an oscillation envelope, so that a huge space is occupied. In addition, the automatic gain control circuit with the aforementioned structure in general requires a time of several bits to acquire a signal level, so that its response time is slower. Furthermore, the AGC circuit is always working on tracing signals, causing a large amount of noise.

SUMMARY OF INVENTION

According to the foregoing description, an object of this invention is to provide an automatic gain control circuit and a method thereof for controlling a start-up time of an oscillator so that no large space is occupied, the response time is fast and no additional noise is made.

According to the object(s) mentioned above, an automatic gain control circuit is provided. The automatic gain control circuit is used to control a start-up time of an oscillator wherein the start-up time of the oscillator varies with a magnitude of an output current of a current generator, for example a saw-tooth wave generator. The automatic gain control circuit comprises an oscillation detection unit and a control unit. The oscillation detection unit is used for outputting a detection signal when the oscillating oscillator is detected. The control unit is coupled to the oscillation detection unit for determining whether the detection signal is received at a first predetermined time point. When the detection signal is not received at the first predetermined time point, the control unit outputs a control signal to increase the output current of the current generator, so that the start-up time of the oscillator is controlled to move forwards. The first predetermined time point can be a latest start-up time to start the oscillation of the oscillator.

In the above automatic gain control circuit, the control unit further comprises: a first flag generator and an output current control circuit. The first flag generator is coupled to the oscillation detection unit for determining whether the detection signal is received at the first predetermined time point. When the detection signal is not received at the first predetermined time point, the first flag generator outputs a first flag signal. In addition, the output current control circuit is coupled to the first flag generator. When the first flag signal is received, the output current control circuit outputs the control signal to increase the output current of the current generator. The first flag generator can be a D-type flip flop.

The output current control circuit can comprise a counter. In order to prevent the counter from counting circularly to reduce the output current of the current generator, the current generator can further comprise an AND gate and a NOR gate, so as to avoid the counter from counting again when the counter counts up to the maximum counting value.

For preventing the oscillator from oscillating too early that will cause the oscillator to become saturated and to receive data that cannot be determined, the control unit can further comprise a second flag generator and a timing circuit. The second flag generator is coupled to the oscillator detection unit for determining whether the detection signal is received at a second predetermined time point. When the detection signal is not received at the second predetermined time point, the second flag generator outputs a second flag signal. In addition, the timing circuit is coupled to the second flag generator for outputting a reset signal to reset a counting value of the counter when the second flag signal is not received for a predetermined time interval. The second predetermined time point can be an earliest start-up time that the oscillator does not oscillate continuously. The second flag generator can be a D-type flip flop. The timing circuit can comprise a counter.

In the aforementioned automatic gain control circuit, the oscillation detection unit can further comprise a comparator and a latch. The comparator is used for detecting an oscillation output of the oscillator. The latch is coupled to the comparator for latching the detection signal. When the comparator detects the oscillation output of the oscillator, the latch outputs the latched detection signal and feedbacks the latched detection to the comparator to disable the comparator, and, therefore, to reduce noise. The comparator can be a delay comparator.

The present invention further provides an automatic gain control method for controlling a start-up time of an oscillator. The start-up time of the oscillator varies with a magnitude of an output current of a current generator. The method comprising steps of: detecting an oscillation output of the oscillator, and then outputting a detection signal when the oscillating oscillator is detected; and of determining whether the detection signal is received at a first predetermined time point. When the detection signal is not received at the first predetermined time point, the control unit outputs a control signal to increase the output current of the current generator, so as to move the start-up time of the oscillator forward.

To prevent the oscillator from oscillating too early and causing the oscillator to become saturated, the method can further comprise steps of: determining whether the detection signal is received at a second predetermined time point; and decreasing the output current of the current generator when the detection signal is received at the second predetermined time point and lasts for a predetermined time interval, so as to delay the start-up time of the oscillator.

A method to increase the output current of the current generator to move the start-up time of the oscillator forward can adjust a gain of the current generator, or can adjust an offset of the output current generated by the current generator.

As described above, according to the aforementioned description, it is not necessary to use a gm-C LPF to extract the energy level of the oscillation envelope, so no large space will be occupied. In addition, because the required start-up time of the oscillation can be quickly adjusted within a time of several pulses of the quench control signal, the response time is very fast. The operation of the oscillation detection unit is turned off after the comparator detects that the oscillation is output, so that no additional noise will be made.

BRIEF DESCRIPTION OF DRAWINGS

While the specification concludes with claims that point out particularly and distinctly claim the subject matter which is regarded as the invention, the objects and features of the invention and further objects, features and advantages thereof will be better understood from the following description taken in connection with the accompanying drawings.

DETAILED DESCRIPTION

Figure 1:
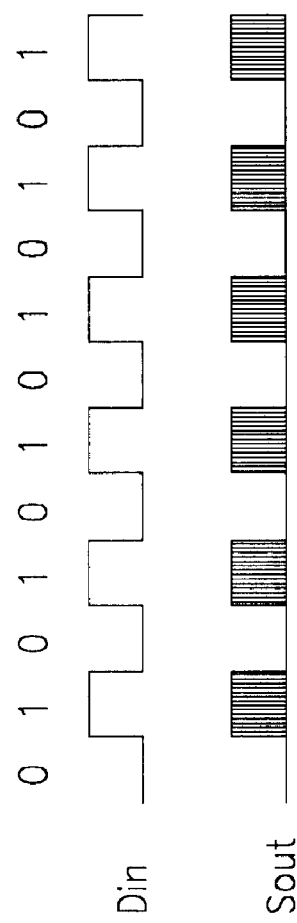
FIG. 1 is a schematic diagram showing a signal modulation of a on-off keying RF transceiver.
Figure 2:
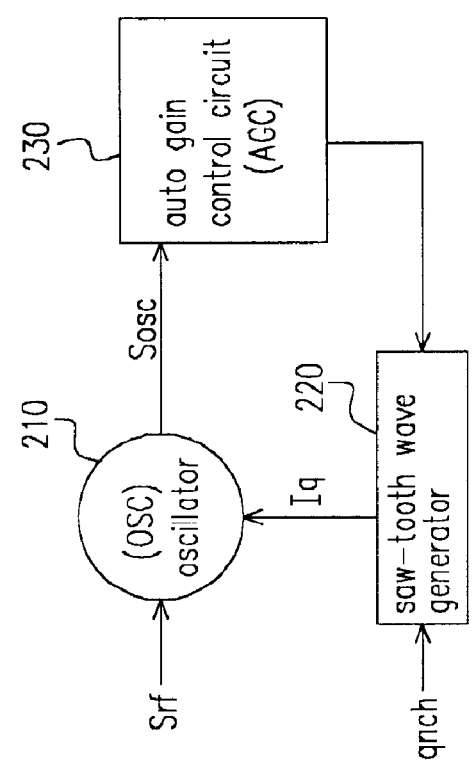
FIG. 2 is a schematic block diagram showing a super-regenerative RF receiver.
Figure 3:
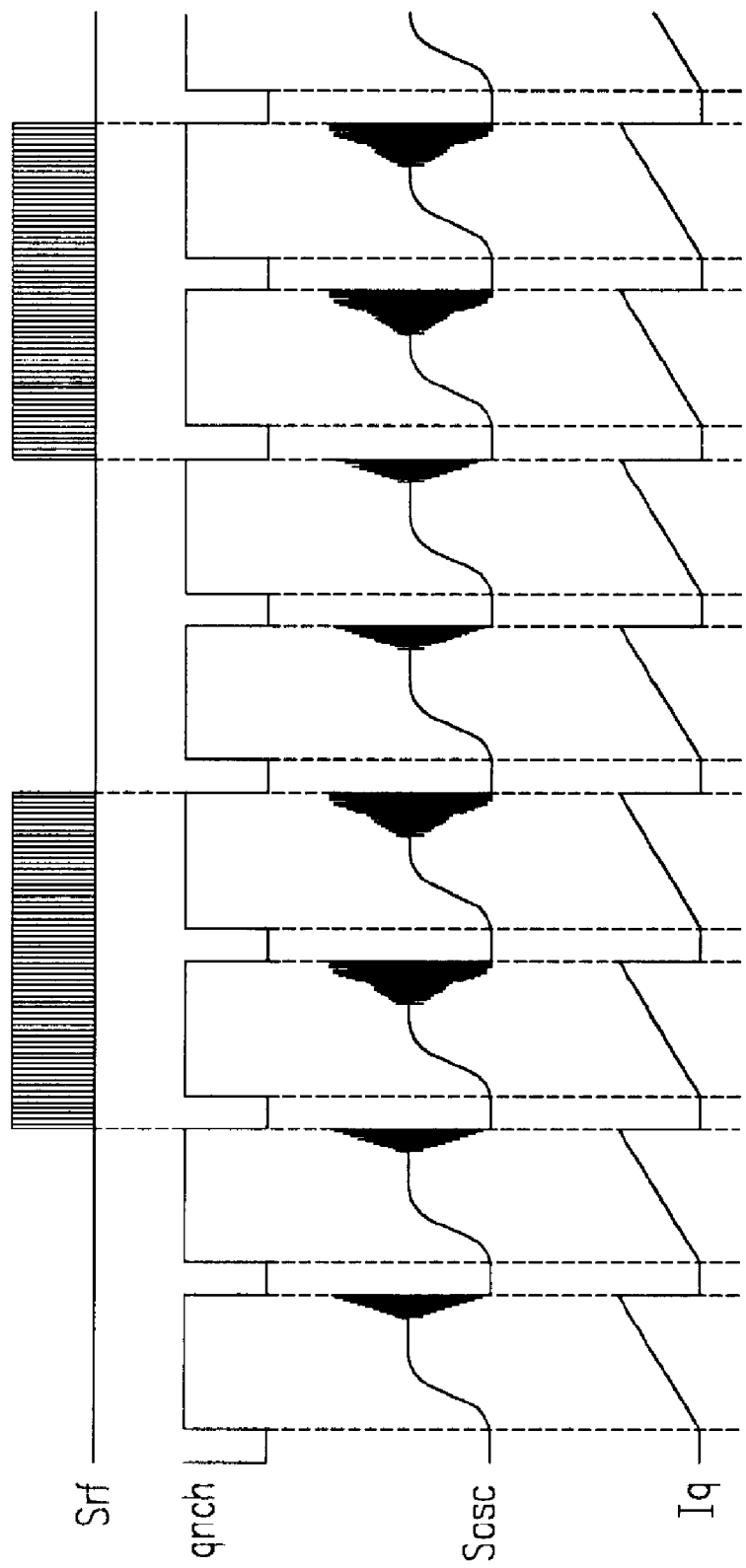
FIG. 3 shows a signal relationship of the super-regenerative RF receiver.
Figure 4:
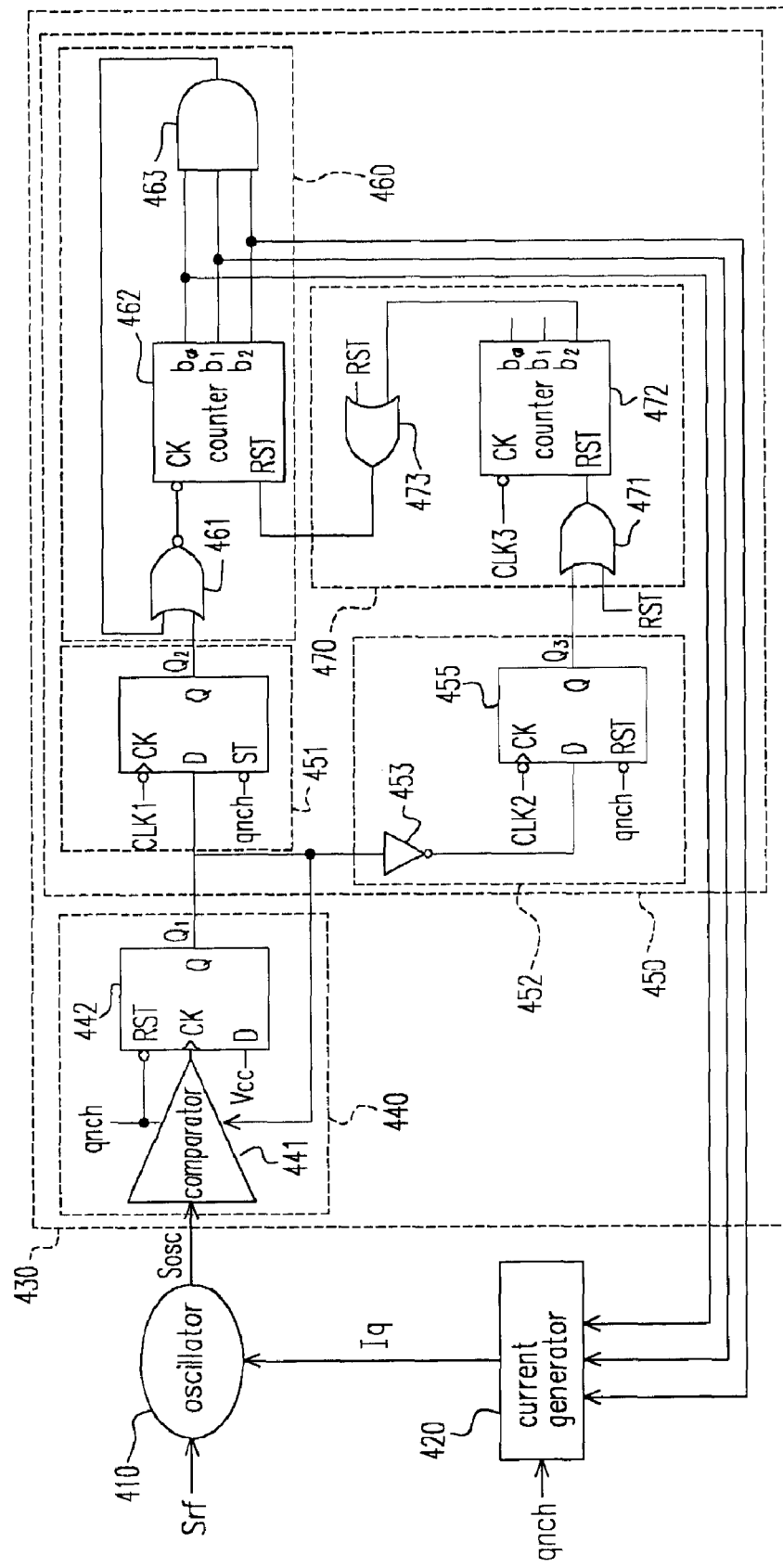
FIG. 4 is a block diagram of an automatic gain control circuit according to one embodiment of the present invention.

FIG. 4 is a block diagram of an automatic gain control circuit according to one embodiment of the present invention. Referring to FIG. 4, the automatic gain control (AGC) circuit 430 is able to control a start-up time of an oscillator 410. The start-up time of the oscillator 410 varies according to a magnitude of an output current Iq of a current generator 420. For convenience, a saw-tooth wave generator is used as the current generator 420. However, for those skilled in this art, a triangle wave generator or a sinusoidal wave generator can also be used.

As shown in FIG. 4, for saving the circuit space, the AGC circuit 430 uses an oscillation detection unit 440 and a control unit 450, rather than uses a gm-C filter. The oscillation detection unit 440 that further comprises a comparator 441 and a latch 442, and the control unit further comprises a first flag generator 451, an output current control circuit 460 for the current generator 420, a second flag generator 452 and a timing circuit 470.

The comparator 441 is a delay comparator. The first flag generator can use a D-type flip-flop. The output current control circuit for the current generator 420 comprises a counter 462, an AND gate 463, and a NOR gate 461. The second flag generator 452 comprises a D-type flip-flop 455 and an inverter 453. The timing circuit 470 comprises a counter 472 and OR gates 471, 473. The operation of the AGC circuit 430 will be described in detail as follows.

Figure 5:
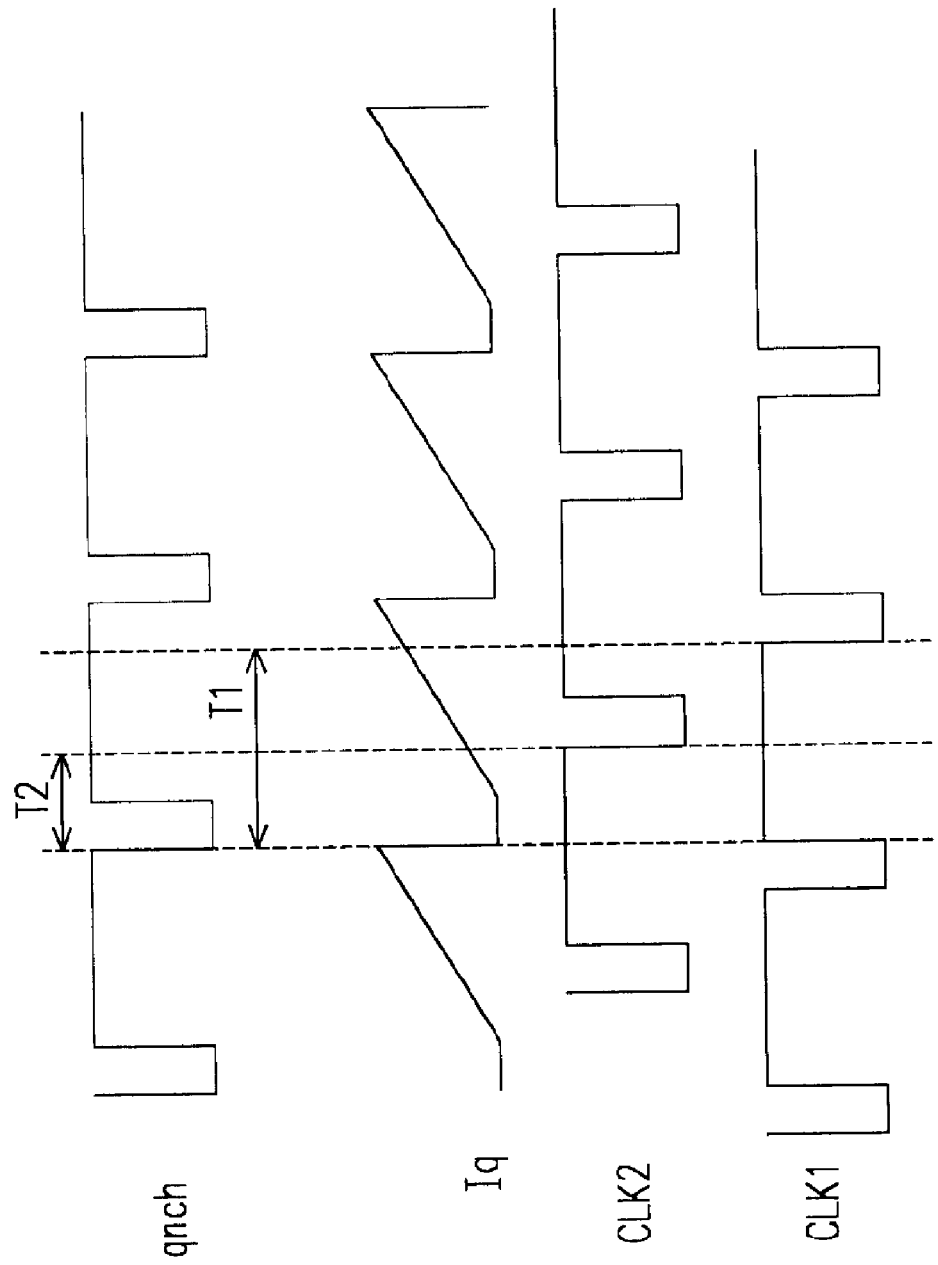
FIG. 5 schematically shows a timing diagram of control signals of the AGC circuit according to the embodiment of the present invention.

FIG. 5 is a timing diagram of control signals. A quench control signal qnch is used to control a sampling rate of an RF signal Srf received by a receiver. Namely, the current generator 420 outputs the saw-tooth wave current Iq only when the quench control signal qnch is "1", so as to provide an energy to the oscillator 410 to oscillate. The start-up time of the oscillation of the oscillator 410 varies according to the magnitude of the output current Iq of the current generator 420. The larger the output current Iq is, the earlier the oscillator 410 oscillates. Therefore, in order to maintain the performance of the receiver under the best condition, it is necessary to use the AGC circuit 430 in FIG. 4 to adjust the output current Iq of the current generator 420, so as to control the start-up time of the oscillator 410.

In addition, in FIG. 5, a first clock signal CLK1 is used to provide a first predetermined time point T1 with respect to the quench control signal qnch; namely, the first predetermined time point T1 is a reference time point at which the output current Iq of the current generator 420 is adjusted so that the oscillator 410 can start oscillating before the first predetermined time point T1. Furthermore, a second clock signal CLK2 is used to provide a second predetermined time point T2 with respect to the quench control signal qnch; namely, the second predetermined time point T2 is a reference time point at which the output current Iq of the current generator 420 is adjusted so that the oscillator 410 can start oscillating before the second predetermined time point T2. In this way, the oscillator 420 can be prevented from entering the saturated status, causing received data that cannot be determined.

In FIG. 4, the comparator 441 detects the oscillation Sosc of the oscillator 410, and then outputs a detected result that is used as an input clock for the latch 442. When the quench control signal qnch is transient to a low level, the comparator 441 and the latch 442 are reset, and therefore, the output of the oscillation detection unit 440 is a low level. When the quench control signal qnch is transient to a high level, e.g., the comparator 441 detects that the oscillator 410 oscillates, the latch 442 will output the latched high level of the detection signal Q1, and the detection signal Q1 is fed back to the comparator 441 to disable the comparator 441, so as to reduce noise.

When the quench control signal qnch is transient to a high level, the first flag generator 451 sets its output as a high level, and uses the first clock signal CLK1 at the first predetermined time point T1 to transmit the output of the latch 442 to the output of the first flag generator 451. Therefore, whether the oscillator 410 has oscillated at the first predetermined time point T1 can determined. In addition, when the oscillator 410 does not oscillate at the first predetermined time point T1, the first flag generator 451 will output a transient first flag signal Q2. When the quench control signal qnch is transient to a low level again, the transient first flag signal Q2 is transmitted to the counter 462 through the NOR gate 461 to increase the counting value of the counter 462. The transient first flag signal Q2 also serves as a control signal to increase the output current of the current generator 420.

For preventing the counter 462 from counting circularly to reduce the output current of the current generator 420, as shown in FIG. 4, the output current control circuit 460 for the current generator 420 uses the AND gate 463 and the NOR gate 461 to prevent the counter 462 from counting again when the counter 462 counts up to the maximum.

When the quench control signal qnch is transient to a low level, the D-type flip flop 452 of the second flag generator 452 will reset its output to a low level. At the second predetermined time point T2, the inverse output of the inverter 453, which is the inverse signal of the output of the latch 442, is transmitted to the output of the D-type flip-flop 452 according to the second clock signal CLK2. In this way, whether the oscillator 410 oscillates at the second predetermined time point T2 can be determined. When the oscillator 410 does not oscillate at the second predetermined time point T2, the second flag generator 452 outputs a high-level second flag signal Q3. The high-level second flag signal Q3 is then transmitted through the OR gate 471 to the counter 472 to reset the output of the counter 472. Therefore, if the high-level second flag signal Q3 is not received for a predetermined time interval (four periods of the third clock signals CLK3), the output of the bit two (b2) of the of the counter 472 becomes a high level due to the counting of the third clock signal CLK3, and a rest signal is output through the OR gate 473 to the counter 462 to reset the output of the counter 462. This manner can prevent the oscillator 410 from oscillating too early and thus entering the saturated status that causes received data cannot be determined. One of input ends of the OR gates 471, 473 is connected to a rest signal RST for resetting the circuit.

Figure 6:
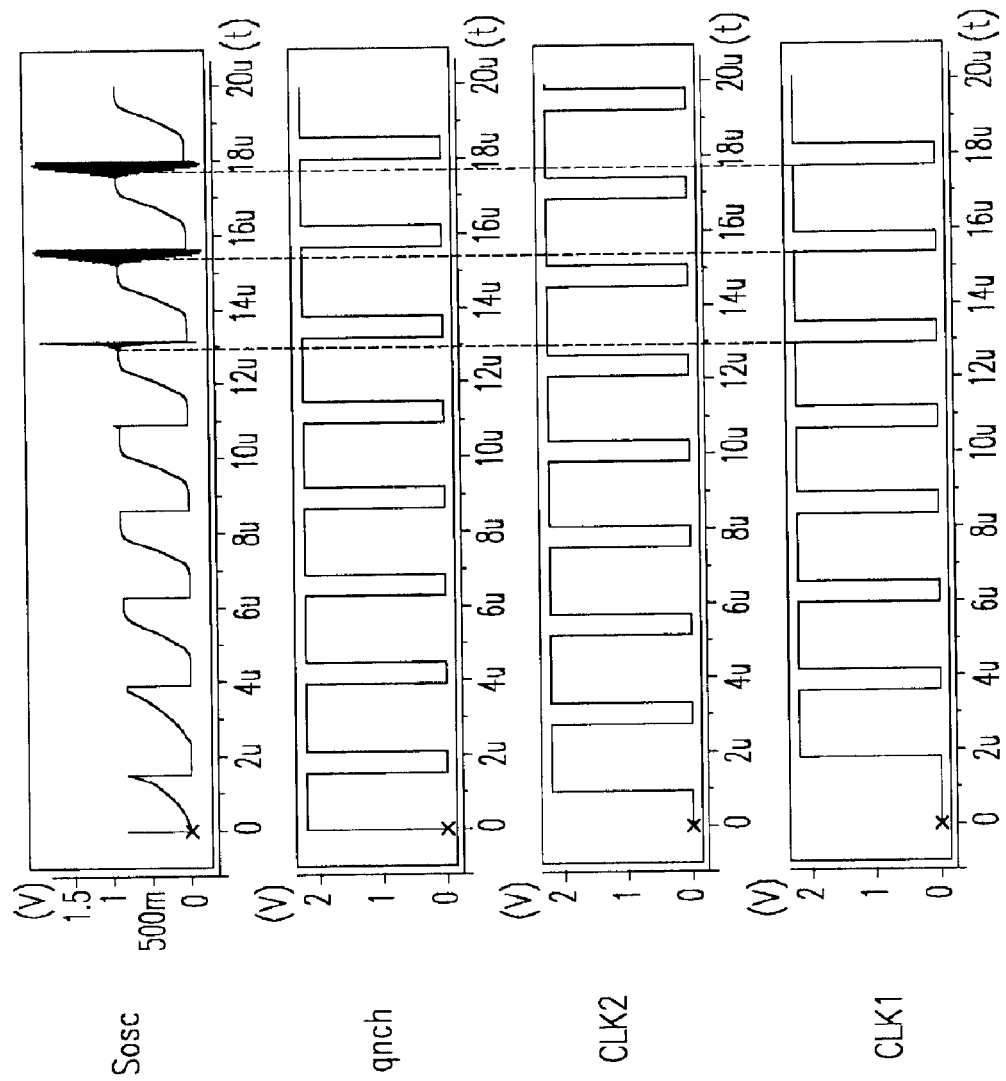
FIG. 6 is a simulation result of the AGC circuit according to the embodiment of the present invention.

FIG. 6 shows a simulation result of the AGC circuit 430 in FIG. 4. From FIG. 6, the start-up time of the oscillation output Ssoc of the oscillator 410 can be quickly adjusted to the first predetermined time point T1 provided by the first clock signal CLK1 at a time of about seven pulses of the quench control signal qnch.

According to the above description, an automatic gain control method is further provided to control a start-up time of an oscillator. The start-up time of the oscillation varies in response to a magnitude of an output current of a current generator, for example a saw-tooth wave generator. The method comprises following steps: detecting an oscillation output of the oscillator and then outputting a detection signal when the oscillation output of the oscillator is detected; and determining whether the detection signal is received at a first predetermined time point. When the detection signal is not received at a first predetermined time point, the output current of the current generator is adjusted to move the start-up time of the oscillation forwards.

Additionally, for preventing the oscillator from oscillating too early so as to cause the oscillator to be saturated, the automatic gain control method further comprises steps of: determining whether the detection signal is received at a second predetermined time point. When the detection signal is received at the second time point and lasts for a predetermined time, the output current of the current generator is reduced to delay the start-up time of the oscillation.

A method to adjust the output current of the current generator to move start-up time of the oscillation forward can adjust the gain of the current generator, or can adjust an offset of the output current of the current generator.

In summary, according to the aforementioned description, the present invention benefits the following advantages.

Since it is not necessary to use a gm-C LPF to extract the energy level of the oscillation envelope, no large space will be occupied. In addition, because the required start-up time of the oscillation can be quickly adjusted within a time of several pulses of the quench control signal, the response time is very fast. The operation of the oscillation detection unit is turned off after the comparator detects that the oscillation is output, so that no additional noise will be made.

While the present invention has been described with a preferred embodiment, this description is not intended to limit our invention. Various modifications of the embodiment will be apparent to those skilled in the art. It is therefore contemplated that the appended claims will cover any such modifications or embodiments as fall within the true scope of the invention.

What is claimed is:

1. An automatic gain control circuit, for controlling a start-up time of an oscillator, wherein the start-up time of the oscillator varies with a magnitude of an output current of a current generator, the automatic gain control circuit comprising:

an oscillation detection unit, for outputting a detection signal when the oscillator oscillates is detected; and a control unit coupled to the oscillation detection unit, for determining whether the detection signal is received at a first predetermined time point, and wherein when the detection signal is not received at the first predetermined time point, the control unit outputs a control signal to increase the output current of the current generator.

2. The automatic gain control circuit of claim 1 wherein the control unit further comprises:

a first flag generator coupled to the oscillation detection unit for determining whether the detection signal is received at the first predetermined time point, wherein when the detection signal is not received at the first predetermined time point, the first flag generator outputs a first flag signal; and an output current control circuit coupled to the first flag generator wherein when the first flag signal is received, the output current control circuit outputs the control signal to increase the output current of the current generator.

3. The automatic gain control circuit of claim 2 wherein the first flag generator comprises a D-type flip flop.

4. The automatic gain control circuit of claim 2 wherein the output current control circuit comprises a counter.

5. The automatic gain control circuit of claim 4 wherein the output current control circuit further comprises an AND gate for receiving outputs of the counter; and a NOR gate for providing a clock signal to the counter and receiving the first flag signal and an output of the AND gate.

6. The automatic gain control circuit of claim 4 wherein the control unit further comprises:
   a second flag generator coupled to the oscillator detection unit for determining whether the detection signal is received at a second predetermined time point, wherein when the detection signal is not received at the second predetermined time point, the second flag generator outputs a second flag signal; and
   a timing circuit coupled to the second flag generator, for outputting a reset signal to reset a counting value of the counter when the second flag signal is not received for a predetermined time interval.

7. The automatic gain control circuit of claim 6 wherein the second flag generator comprises a D-type flip-flop.

8. The automatic gain control circuit of claim 6 wherein timing circuit comprises a counter.

9. The automatic gain control circuit of claim 1 wherein the oscillation detection unit further comprises:
   a comparator for detecting an oscillation output of the oscillator; and
   a latch coupled to the comparator, for latching the detection signal, wherein when the comparator detects the oscillation output of the oscillator, the latch outputs the latched detection signal and feedbacks the latched detection to the comparator to disable the comparator.

10. The automatic gain control circuit of claim 9 wherein the comparator is a delay comparator.

11. An automatic gain control method for controlling a start-up time of an oscillator, wherein the start-up time of the oscillator varies with a magnitude of an output current of a current generator, the method comprising steps of:
   detecting an oscillation output of the oscillator, and then outputting a detection signal when the oscillator oscillates is detected; and
   determining whether the detection signal is received at a first predetermined time point wherein when the detection signal is not received at the first predetermined time point, the control unit outputs a control signal to increase the output current of the current generator.

12. The method of claim 11, further comprising steps of:
   determining whether the detection signal is received at a second predetermined time point; and
   decreasing the output current of the current generator when the detection signal is received at the second predetermined time point and lasts for a predetermined time interval.

13. The method of claim 11 wherein a method to increase the output current of the current generator is to adjust a gain of the current generator.

14. The method of claim 11 wherein a method to increase the output current of the current generator is to adjust an offset of the output current generated by the current generator.

* * * * *